(12) United States Patent
Jiang et al.

(10) Patent No.: US 11,822,116 B1
(45) Date of Patent: Nov. 21, 2023

(54) DISPLAY DEVICE AND BACKLIGHT MODULE THEREOF INCLUDING RADIATOR WITH HEAT ABSORPTION PART, CONDENSATION PART, AND PIPE

(71) Applicant: HKC CORPORATION LIMITED, Shenzhen (CN)

(72) Inventors: Xingjia Jiang, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/084,494

(22) Filed: Dec. 19, 2022

(30) Foreign Application Priority Data

Aug. 24, 2022 (CN) .......................... 202211021276.9

(51) Int. Cl.
*F21V 8/00* (2006.01)
*H05K 7/20* (2006.01)
*G02F 1/1333* (2006.01)
*G02F 1/1335* (2006.01)
*F21V 29/51* (2015.01)

(52) U.S. Cl.
CPC ......... *G02B 6/0085* (2013.01); *G02B 6/0028* (2013.01); *G02B 6/0088* (2013.01); *G02F 1/133314* (2021.01); *G02F 1/133628* (2021.01); *H05K 7/2039* (2013.01); *H05K 7/20318* (2013.01); *F21V 29/51* (2015.01)

(58) Field of Classification Search
CPC . F21V 29/51; G02B 6/0085; G02F 1/133314; G02F 1/133628
See application file for complete search history.

(56) References Cited

U.S. PATENT DOCUMENTS 8,760,865 B2 * 6/2014 Tang .......................... G06F 1/20
361/698
2012/0069549 A1 3/2012 Hsu
(Continued)

FOREIGN PATENT DOCUMENTS

| CN | 101949526 A | 1/2011 |
| CN | 102313191 A | 1/2012 |
| CN | 202253141 U | 5/2012 |

(Continued)

OTHER PUBLICATIONS

Chinese First Office Action, Chinese Application No. 202211021276. 9, dated May 25, 2023 (13 pages).
(Continued)

*Primary Examiner* — Keith G. Delahoussaye

(57) ABSTRACT

The present disclosure provides a display device and a backlight module thereof, the backlight module comprises a back plate, light bars and a radiator, and the back plate comprises a bottom plate and a first side plate disposed at one side of the bottom plate. The light bar is disposed at the inner side of the first side plate; the radiator comprises a heat absorption part, a condensation part and a pipe, the heat absorption part and the condensation part are communicated with each other by the pipe. the heat absorption part is disposed between the first side plate and the light bar, and the heat absorption part is configured to absorb the heat emitted by the light bar; and the condensation part is disposed at the outer side of the bottom plate.

20 Claims, 3 Drawing Sheets

(56) References Cited

U.S. PATENT DOCUMENTS

| | | | |
|---|---|---|---|
| 2015/0138830 A1* | 5/2015 | Yu ......................... | G02F 1/1336 362/609 |
| 2017/0102137 A1* | 4/2017 | Cho ........................ | F21V 29/65 |

FOREIGN PATENT DOCUMENTS

| | | |
|---|---|---|
| CN | 102900989 A | 1/2013 |
| CN | 103591568 A | 2/2014 |
| CN | 204494231 U | 7/2015 |
| CN | 204648019 U | 9/2015 |
| CN | 106647019 A | 5/2017 |
| CN | 106871676 A | 6/2017 |
| CN | 206398471 U | 8/2017 |
| CN | 107504401 A | 12/2017 |
| CN | 214896116 U | 11/2021 |
| WO | 2018176636 A1 | 10/2018 |

OTHER PUBLICATIONS

Chinese Second Office Action, Chinese Application No. 202211021276.9, dated Jun. 29, 2023 (13 pages).

* cited by examiner

DISPLAY DEVICE AND BACKLIGHT MODULE THEREOF INCLUDING RADIATOR WITH HEAT ABSORPTION PART, CONDENSATION PART, AND PIPE

CROSS REFERENCE TO RELATED APPLICATIONS

The present disclosure is a continuation of Chinese Patent Application No. 202211021276.9, entitled "DISPLAY DEVICE AND BACKLIGHT MODULE THEREOF", filed on Aug. 24, 2022, the contents of which are herein incorporated by reference in their entireties.

TECHNICAL FIELD

The present disclosure relates to the field of display technology, and in particular, to a display device and a backlight module thereof.

BACKGROUND

As people's requirements for the performance of display devices is higher and higher, HDR (High Dynamic Range Imaging) technology is a processing technology to improve the brightness and contrast of images. And HDR can brighten the details of each dark part, darken the dark part, enrich more details and colors, and make movies and pictures show excellent results. HDR's disclosure in mid and high level displays on the current market has become the nom. However, the high brightness and high contrast of HDR technology means that LED (light-emitting diode) bulbs with higher brightness and wider color gamut are needed, so a large current supply is needed, and a higher temperature rise of the light bar is generated, which is not good for the life of LED bulbs, the reliability of the whole backlight module and the experience of end users. Because LED is a photoelectric element, 15%~25% of the electric energy can be converted into light energy during the working process, and most of the other electric energy is almost converted into heat energy, which makes the temperature of LED element increasing, and the whole backlight system is in a relatively sealed space. If the heat keeps accumulating, when the temperature of LED element rises to exceed maximum allowable temperature, the LED element will be damaged due to overheating, which further affects the service life of the LED. Therefore, it is necessary to design the heat dissipation of the backlight of a high-performance HDR display. At present, the commonly used heat dissipation method of the backlight is to connect the light bar with the back plate through thermal adhesive, and the backlight dissipates heat by the metal back plate contacting with the outside air, which has the issue of weak heat dissipation capacity.

SUMMARY

The present disclosure provides a display device and a backlight module thereof, in order to overcome the problem that the heat dissipation capacity of backlight module is weak in the prior art.

In order to overcome the aforementioned technical problems, the first aspect is provided by the present disclosure is a backlight module, includes:

a back plate, includes a bottom plate and a first side plate disposed at one side of the bottom plate;
a light bar, disposed at the inner side of the first side plate;
a radiator, comprises a heat absorption part, a condensation part and a pipe; wherein the heat absorption part and the condensation part are communicated with each other by the pipe;

Furthermore, the bottom plate comprises a first edge and a second edge which are opposite to each other along a first direction; the first edge is configured to be disposed corresponding to the bottom side of a display panel, and the second edge is configured to be disposed corresponding to the top side of the display panel; the first side plate, the light bar and the heat absorption part are disposed on the first edge, and the condensation part is disposed on between first edge and the second edge, and the condensation part is spaced from the heat absorption part.

Furthermore, the condensation part comprises a top wall and a bottom wall which are opposite to each other and substantially parallel to the bottom plate, and a first side wall and a second side wall which are connected to the top wall and the bottom wall, and the first side wall is located on the side of the second side wall near the first side plate and bent toward the side of the first side plate.

Furthermore, a bent portion of the first side wall is located in the middle of the first side wall along the second direction, and the second direction is perpendicular to the first direction; along the second direction, from the middle of the condensation part to both ends of the condensation part, the width of the condensation part in the first direction is gradually increased.

Furthermore, the first side wall is a bent planar structure, and the second side wall is a planar structure.

Furthermore, the top wall is located on the side of the bottom wall away from the bottom plate; the surface of the top wall away from the bottom plate is provided with a plurality of radiating fins.

Furthermore, the plurality of radiating fins is disposed at intervals along a second direction, and the second direction is perpendicular to the first direction; along the first direction, one end of each of the plurality of radiating fins extends to the first side wall, and the other end of each of the plurality of radiating fins extends to the second side wall.

Furthermore, the number of the pipe is two, which comprises a first pipe and a second pipe; the first pipe is disposed on one side of the bottom plate along a second direction, and the second pipe is disposed on the other side of the bottom plate along a second direction, the second direction is perpendicular to the first direction; the first end of the heat absorption part is communicated with the first end of the condensation part by the first pipe; the second end of the heat absorption part is communicated with the second end of the condensation part by the second pipe.

Furthermore, the back plate further comprises a second side plate and a third side plate which are opposite to each other and connected with both ends of the first side plate; one end of the first pipe is connected with one end of the heat absorption part near the second side plate, and the other end of the first pipe passes through the second side plate and extends away from the first side plate, and the other end of the first pipe is connected with one end of the condensation part near the second side plate.

one end of the second pipe is connected with one end of the heat absorption part near the third side plate, and the other end of the second pipe passes through the third side plate and extends away from the first side plate, and the other end of the second pipe is connected with one end of the condensation part near the third side plate.

In order to overcome the aforementioned technical problems, the second aspect is provided by the present disclosure is a display device, which includes a display panel and the backlight module.

BRIEF DESCRIPTION OF THE DRAWINGS

In order to more clearly illustrate the technical solutions of the embodiments of the present disclosure, the drawings for the description of the embodiment will be described in brief Obviously, the drawings in the following description are only some of the embodiments of the present disclosure. For a person of ordinary skill in the art, other drawings may be obtained based on the following drawings without any creative work.

DETAILED DESCRIPTION

In the following description, for the purpose of explanation rather than limitation, specific details such as specific system structural, interfaces and technologies are set forth, in order to provide a fully understanding of the present disclosure.

Technical solutions of the embodiments of the present disclosure will be clearly and comprehensively described by referring to the accompanying drawings. Obviously, the embodiments described herein are only a part of, but not all of, the embodiments of the present disclosure. Based on the embodiments in the present disclosure, all other embodiments obtained by a person of ordinary skill in the art without any creative work shall fall within the scope of the present disclosure.

In addition, when using expressions "first", "second", and the like in the embodiment of the present disclosure, the expressions "first", "second", and the like are used for descriptive purposes only, and shall not be interpreted as indicating or implying relative importance or implicitly specifying the number of an indicated technical feature. Therefore, features defined by "first" and "second" may explicitly or implicitly include at least one of the such feature. In addition, technical solutions of various embodiments may be combined with each other, but only on the basis that the technical solutions may be achieved by a person of ordinary skill in the art. When combination of technical solutions appears to be contradictory or unachievable, such combination of technical solutions shall be interpreted as inexistence and excluded from the scope of the present disclosure.

The reference to "an embodiment" means that a specific feature, structure or characteristic described in connection with an embodiment may be included in at least one embodiment of present disclosure. The appearance of "an embodiment" in various places in the specification does not necessarily refer to the same embodiment, nor is it an independent or alternative embodiment mutually exclusive with other embodiments. It is understood explicitly and implicitly by those skilled in the art that the embodiments described in the present disclosure can be combined with other embodiments.

Figure 1:
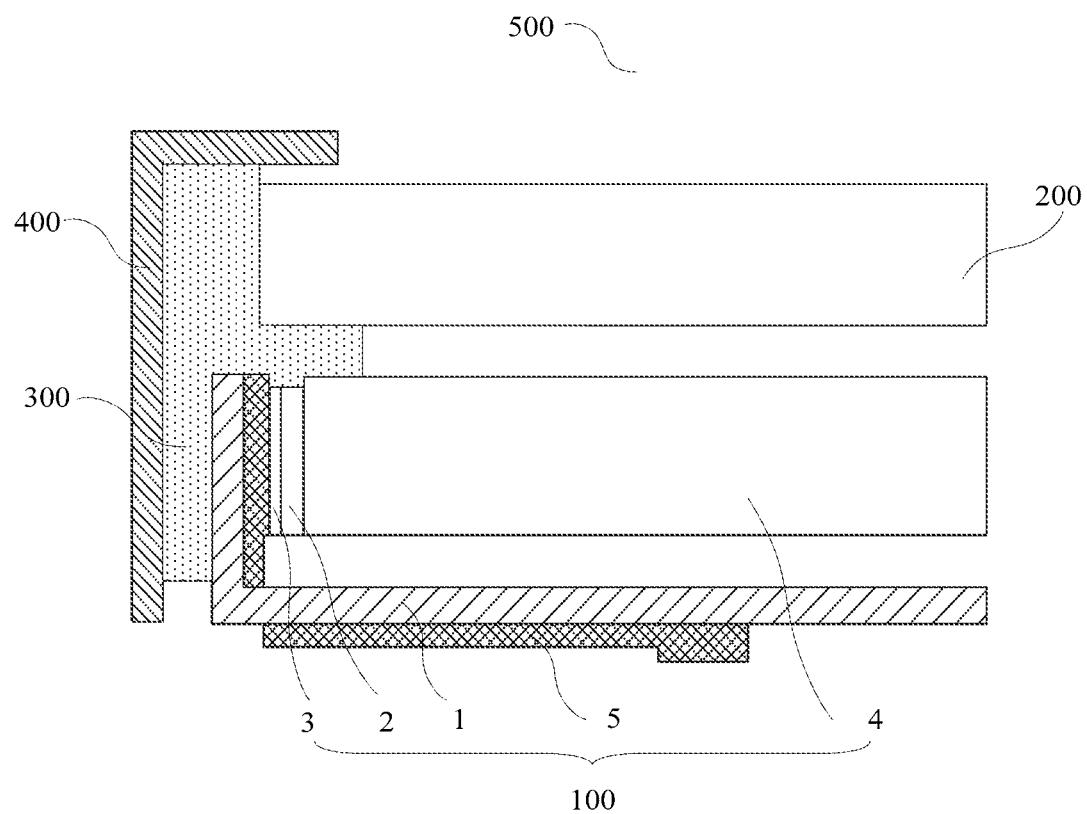
FIG. 1 is a structural schematic view of an embodiment of a display device according to the present disclosure.

Referring to FIG. 1, FIG. 1 is a structural schematic view of an embodiment of a display device according to the present disclosure.

The present disclosure provides a display device 500, which includes a backlight module 100, a display panel 200, a subbing frame 300 and a shell 400. The display panel 200 is disposed opposite to the backlight module 100, and the subbing frame 300 is disposed at the sides of the display panel 200 and the backlight module 100, and the subbing frame 300 is configured to stick the display panel 200 and the backlight module 100 together and sealing a gap between the display panel 200 and the backlight module 100. The shell 400 is disposed on one side of the subbing frame 300 away from the display panel 200, and is configured to packaging the display panel 200 and the backlight module 100. The display device 500 may further includes one or more of the following assemblies: a memory, a power supply assembly, a processing assembly, a multimedia assembly, an audio assembly, an input/output (I/O) interface, a sensor assembly, and a communication assembly. The specific structures and functions of these assembly are the same as or similar to those in the prior art, and the details can be found in the prior art, which will not be repeated here.

The display device 500 may be a computer, a digital broadcast terminal, a message transceiving device, a game console, a medical device, a fitness device, a personal digital assistants, etc., which are not specifically limited in the present disclosure.

The display panel 200 can be a liquid crystal panel. The display panel 200 further provides a display area (not shown in figures) and a non-display area (not shown in figures) surrounding the display area. The display area is configured to set structures such as pixels, driving circuits, data signal lines, scanning signal lines and the like. The non-display area is configured to set the scanning circuit, testing circuit, display control circuit, etc.

Figure 2:
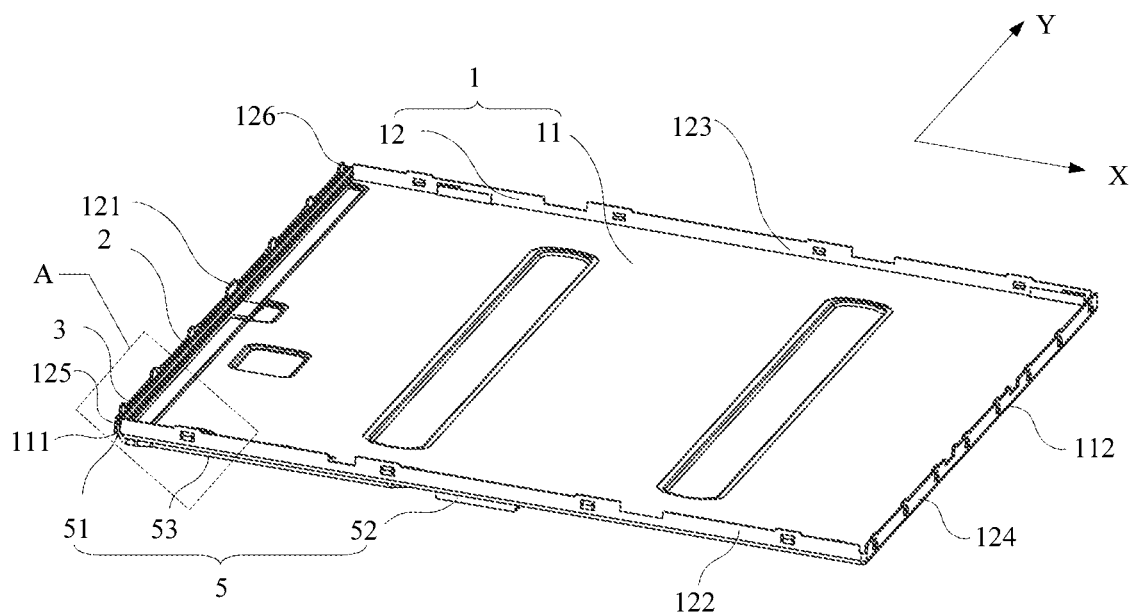
FIG. 2 is a structural schematic view of an embodiment the back plate, the light bar and the radiator provided after assembly according to the present disclosure.
Figure 3:
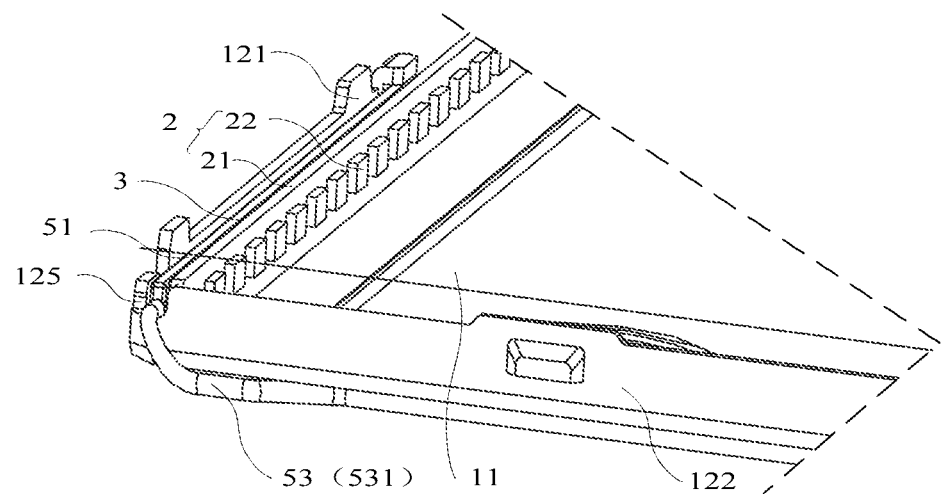
FIG. 3 is a partial enlarged view of part A in FIG. 2.

Referring to FIG. 2 and FIG. 3. FIG. 2 is a structural schematic view of an embodiment the back plate, the light bar and the radiator provided after assembly according to the present disclosure, and FIG. 3 is a partial enlarged view of part A in FIG. 2.

The present disclosure provides a backlight module 100, which includes a back plate 1, a light bar 2, a radiator 5, a thermal adhesive 3 and an optical component 4. The optical assembly 4 is located between the back plate 1 and the display panel 200, and the optical assembly 4 is configured to convert the light emitted by the light bar 2 into a high-brightness and uniform surface light source, and conduct to the display panel 200 to improve the luminous efficiency. The light bar 2 is disposed on the inner side of the back plate 1, and located on the side of the optical assembly 4 near the shell 400. One end of the radiator 5 is disposed between the back plate 1 and the light bar 2, and the other end of the radiator 5 is disposed on the side of the back plate 1 far away from the display panel 200 to heat radiation for the light bar 2. The thermal adhesive 3 is configured to fix the radiator 5 on the light bar 2, and the thermal adhesive 3 can conduct the heat emitted by the light bar 2 to the radiator 5 better.

The optical assembly 4 includes a light guide plate (not shown), a diffusion sheet (not shown), a prism sheet (not shown), a reflection sheet (not shown), etc. The specific structures and functions of these assemblies are the same as or similar to those of the prior art. For details, please refer to the prior art, which will not be described in detail here.

The back plate 1 includes a side plate 12 and a bottom plate 11 which are connected to each other. The bottom plate 11 is disposed on the side of the optical assembly 4 away from the display panel 200, and the side plate 12 is disposed on the side of the bottom plate 11 facing the display panel 200. The side plate 12 and the bottom plate 11 are made integrally. The side plate 12 includes a first side plate 121 and a fourth side plate 124 which are opposite to each other, and includes a second side plate 122 and a third side plate 123 which are opposite to each other. The second side plate 122 and/or the third side plate 123 may be connected with the first side plate 121; the second side plate 122 and the third side plate 123 may not be connected to the first side plate 121, so that the second side plate 122 defines a gap with the first side plate 121, and the third side plate 123 defines a gap with the first side plate 121. The bottom plate 11 includes a first side 111 and a second side 112 which are opposite disposed along a first direction X. The first side 111 is disposed corresponding to a bottom side of the display panel 200, and the second side 112 is disposed corresponding to a top side of the display panel 200. The first direction X is the vertical direction from the first side plate 121 to the fourth side plate 124. The first side plate 121 is disposed on the first side 111 of the bottom plate 11, and the fourth side plate 124 is disposed on the second side 112 of the bottom plate 11.

The light bar 2 is disposed on the inner side of the first side plate 121, namely, the light bar 2 is disposed on the side of the first side plate 121 near the fourth side plate 124. The light bar 2 is disposed on the first side 111 of the bottom plate 11. The light bar 2 includes a circuit board 21 and a light-emitting element 22 disposed on the circuit board 21 at intervals. The circuit board 21 is disposed on the side of the first side plate 121 near the fourth side plate 124, and the light-emitting element 22 is disposed on the side of the circuit board 21 away from the first side plate 121. The circuit board 21 is configured to control the light-emitting element 22 to emit light. The light-emitting element 22 can be a Cold Cathode Fluorescent Lamp or a light-emitting diode (LED) lamp beads, which is not limited here. In the embodiment, the light-emitting element 22 is a LED lamp beads. The light bar 2 is only disposed on one side of the first side plate 121 near the fourth side plate 124.

Figure 4:
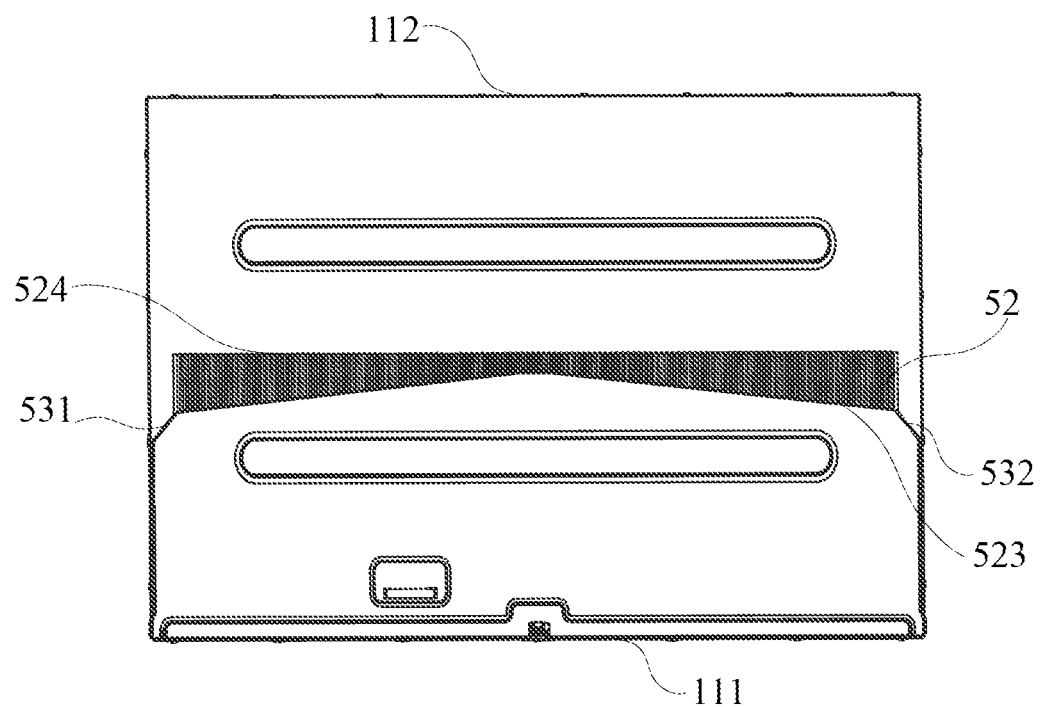
FIG. 4 is another perspective structural schematic view of the back plate, the light bar and the radiator after assembly in FIG. 2.
Figure 5:
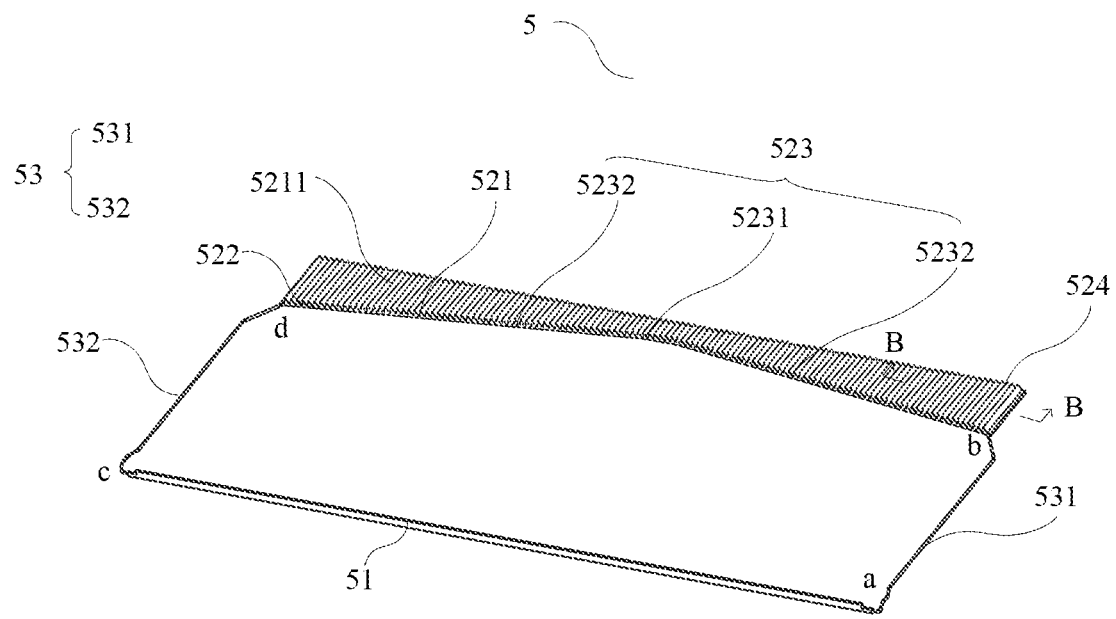
FIG. 5 is a structural schematic view of an embodiment of a radiator provided in the present disclosure.
Figure 6:
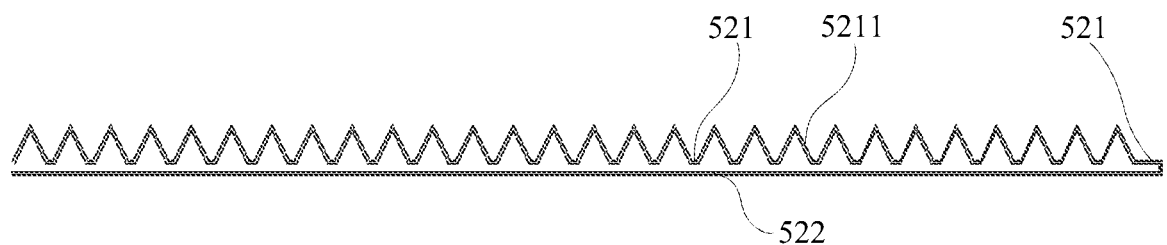
FIG. 6 is a cross-sectional structural view along the B-B direction in FIG. 5.

Referring to FIG. 4 to FIG. 6. FIG. 4 is another perspective structural schematic view of the back plate, the light bar and the radiator after assembly in FIG. 2, FIG. 5 is a structural schematic view of an embodiment of a radiator provided in the present disclosure, and FIG. 6 is a cross-sectional structural view along the B-B direction in FIG. 5.

The radiator 5 includes a heat absorption part 51, a condensation part 52, and a pipe 53 connecting the heat absorption part 51 and the condensation part 52. The heat absorption part 51 is disposed between the first side plate 121 and the light bar 2, namely, the heat absorption part 51 is clamped between the first side plate 121 and the light bar 2 and is disposed on the first side 111 of the bottom plate 11. The condensation part 52 is disposed on the outside of the bottom plate 11, namely, the condensation part 52 is disposed on the side of the bottom plate 11 away from the display panel 200. The condensation part 52 is disposed on the outer side of the bottom plate 11, so that the condensation part 52 can be contacted with the outside air better, and the heat dissipation effect is better. At the same time, the condensation part 52 is disposed on the outer side of the bottom plate 11, so that the design obstacle of the high-performance display module which cannot be applied due to the severe heat generation of the light-emitting element 22 can be eliminated to a certain extent, and the design upper limit can be raised.

The heat absorption part 51 is configured to absorb the heat emitted by the light-emitting elements 22 on the light bar 2. The heat atomizes the coolant in the heat absorption part 51, and spreads to the condensation part 52 through the pipe 53, forms thermal convection with the outside air, cooling condensates into liquid, and then flows back to the heat absorption part 51 through the pipe 53 to continue working, the working process circulates in the radiator 5, and continues to dissipate heat for the heat-emitting elements 22.

The heat absorption part 51 is fixed on the first side plate 121 and/or the light bar 2 by the thermal adhesive 3, and the heat absorption part 51 is prevented from being displaced. Namely, the thermal adhesive 3 may be disposed between the first side plate 121 and the heat absorption part 51; or between the light bar 2 and the heat absorption part 51; and the thermal adhesive 3 also can be disposed both between the first side plate 121 and the heat absorption part 51, and between the light bar 2 and the heat absorption part 51. thermal adhesive 3 can be thermal conductive silica gel or other insulating materials with viscosity and thermal conductivity. In the embodiment, the thermal adhesive 3 is disposed between the first side plate 121 and the heat absorption part 51, and the heat emitted by the light-emitting elements 22 on the light bar 2 is conducted to the heat absorption part 51 through the circuit board 21 and the thermal adhesive 3 in turn, and the heat is absorbed by the heat absorption part 51. The heat absorption part 51 has a rectangular structure. In other embodiments, the heat absorbing portion 51 may be other structures, as long as the heat absorbing portion 51 can absorb the heat of the light bar 2.

There are two pipes 53, namely the first pipe 531 and the second pipe 532. The first pipe 531 and the second pipe 532 are respectively disposed on both sides of the bottom plate 11 along a second direction Y, and the second direction Y is perpendicular to the first direction X. The second direction Y is the vertical direction from the second side plate 122 to the third side plate 123. The first end a of the heat absorption part 51 is communicated with the first end b of the condensation part 52 by the first pipe 531, and the second end c of the heat absorption part 51 is communicated with the second end d of the condensation part 52 by the second pipe 532. Namely, the first end a of the heat absorption part 51 and the first end b of the condensation part 52 are located on the same side of the bottom plate 11 along the second direction Y, and the second end c of the heat absorption part 51 and the second end d of the condensation part 52 are located on the same side of the bottom plate 11 along the second direction Y. The heat absorption part 51, the first pipe 531, the condensation part 52 and the second pipe 532 are connected end to end in turn, so that the radiator 5 forms a closed channel. That is to say, the heat absorption part 51 and the condensation part 52 are communicated only through the first pipe 531 and the second pipe 532, so that the circulating heat dissipation of the radiator 5 can be realized, and the structure is simple. In the embodiment, one end of the first pipe 531 is connected to one end of the heat absorption part 51 near the second side plate 122, and the other end of the first pipe 531 passes through the second side plate 122 and extends away from the first side plate 121, and the other end of the first pipe 531 is connected to one end of the condensation part 52 near the second side plate 122. One end of the second pipe 532 is connected to one end of the heat absorption part 51 near the third side plate 123, and the other end of the second pipe 532 passes through the third side plate 123 and extends away from the first side plate 121, and the other end of the second pipe 532 is connected to one end of the condensation part 52 near the third side plate 123. A first notch structure 125 is provided at a junction of the second side plate 122 and the first side plate 121, and a second notch structure 126 is provided at a junction of the third side plate 123 and the first side plate 121. The first pipe 531 passes through the second side plate 122 through the first notch structure 125, and the second pipe 532 passes through the third side plate 123 through the second notch structure 126. In other embodiments, the first notch structure 125 may only be provided on the first side plate 121 or the second side plate 122, and the second notch structure 126 may only be provided on the first side plate 121 or the third side plate 123, which is selected according to the actual design. The shapes and sizes of the first notch structure 125 and the second notch structure 126 are not limited as long as the first pipe 531 can pass through the second side plate 122 and the second pipe 532 can pass through the third side plate 123. It should be understood that when the second side plate 122 is not connected with the first side plate 121, the first pipe 531 may extend to the outside of the bottom plate 11 through the gap between the first side plate 121 and the second side plate 122, and similarly, the second pipe 532 may extend to the outside of the bottom plate 11 through the gap between the first side plate 121 and the third side plate 123.

The condensation part 52 is disposed on the side of the first side 111 of the bottom plate 11 near the second side 112, and the condensation part 52 is spaced from the heat absorption part 51, and extended along the second direction Y. The condensation part 52 and the heat absorption part 51 are respectively disposed on the side plate 12 and the bottom plate 11 of the back plate 1, which can avoid the expansion and deformation of the radiator 5 caused by a large amount of gas generated by the coolant in the heat absorption part 51 in the process of continuous heat absorption and vaporization, thus the structure of the backlight module 100 is affected and undesirable phenomena can be caused. The heat absorption part 51 is disposed on the first side 111, and the condensation part 52 is disposed on the side of the first side 111 near the second side 112. Namely, when the display panel 200 is placed normally, the condensation part 52 is disposed away from the ground plane relative to the heat absorption part 51, so that the coolant in the heat absorption part 51 rises to the condensation part 52 through the pipe 53 after heat absorption and vaporization, and then cooling condensates in the condensation part 52 into a liquid, and the liquid flows back to the heat absorption part 51 through the pipe 53 under the action of gravity, the heat dissipation function of the radiator 5 can be realized by gravity only, without external power, which structure is simple, and convenient to apply. In the embodiment, the condensation part 52 is disposed in the middle of the bottom plate 11, which can improve the heat dissipation efficiency without affecting the normal operation of the circuit in the non-display area.

The condensation part 52 includes a top wall 521 and a bottom wall 522 which are opposite to each other and parallel to the bottom plate 11, and a first side wall 523 and a second side wall 524 which are connected the top wall 521 and the bottom wall 522. The top wall 521 of the condensation part 52 is located on the side of the bottom wall 522 away from the bottom plate 11. The surface of the top wall 521 away from the bottom plate 11 is provided with a plurality of radiating fins 5211, and the radiating fins 5211 are spaced along the second direction Y perpendicular to the first direction X. The radiating fin 5211 can be a hollow structure, and the inner side wall of the radiating fin 5211 is communicated with the top wall 521 of the condensation part 52. In the embodiment, one end of the radiating fin 5211 extends to the first side wall 523 and the other end of the radiating fin 5211 extends to the second side wall 524 along the first direction X. Since disposing the radiating fins 5211, a contact area between the vaporized coolant in the condensation part 52 and the outside air can be increased, and the radiating effect can be improved. At the same time, a guiding gutter can be formed in the condensation part 52, so that the vaporized and condensed coolant can flow into the pipe 53 and flow back to the heat absorption part 51 faster. In the embodiment, the plurality of radiating fins 5211 is disposed in parallel along the first direction X. On the plane perpendicular to the bottom plate 11, a cross-sectional area of the radiating fins 5211 is triangular.

In other embodiments, the cross-sectional area of the radiating fin 5211 may be rectangular, fan-shaped, trapezoidal and other shapes. The end of the radiating fin 5211 may not extend to the first side wall 523 and/or the second side wall 524. For example, the radiating fin 5211 may be disposed at the middle of the surface of the top wall 521 away from the bottom plate 11, or one end of the radiating fin 5211 may extend to the first side wall 523 or one end of the radiating fin 5211 may extend to the second side wall 524. The radiating fins 5211 may be disposed at an angle to the first direction X. The shape and/or size of each radiating fin 5211 may be the same or different.

The first side wall 523 is located on the side of the second side wall 524 near the first side plate 121 and bent toward the side of the first side plate 121. The first side wall 523 is a bent planar structure, and the second side wall 524 is a planar structure. The first side wall 523 includes two straight portions 5232 and a bent portion 5231 connecting the two straight portions 5232. The bent portion 5231 is located away from the first side plate 121 relative to the straight portion 5232. In the embodiment, the bent portion 5231 of the first side wall 523 is located in the middle of the first side wall 523 along the second direction Y perpendicular to the first direction X. Along the second direction Y, the width of the condensation part 52 in the first direction X gradually increases from the middle of the condensation part 52 to both ends of the condensation part 52. When the display device 500 is in normal operation, the bent portion 5231 and the two straight portions 5232 form slopes respectively, so that the vaporized coolant condenses in the radiating fins 5211 and drops down to the straight portions 5232 under the action of gravity, and the coolant gathers fast at the lowest point of the first side wall 523. Namely, the connection between the first side wall 523 and the pipe 53, and then flows back to the heat absorption part 51 through the pipe 53. Since disposing the first side wall 523 into a bent planar structure, the speed of the condensed coolant flowing back to the pipe 53 can be accelerated, which is beneficial to improving the heat dissipation effect. In other embodiments, the bent portion 5231 may be located between the middle of the first side wall 523 along the second direction Y and the end of the first side wall 523 along the second direction Y. The width of the condensation part 52 in the first direction X gradually increases from the bent portion 5231 of the condensation part 52 to the end of the condensation part 52 along the second direction Y.

The present disclosure provides a backlight module 100. The backlight module 100 includes a back plate 1, a light bar 2 and a radiator 5. The back plate 1 includes a bottom plate 11 and a first side plate 121 disposed on one side of the bottom plate 11. The light bar 2 is disposed at the inner side of the first side plate 121. The radiator 5 includes a heat absorption part 51, a condensation part 52 and a pipe 53 communicating the heat absorption part 51 and the condensation part 52; The heat absorption part 51 is disposed between the first side plate 121 and the light bar 2, and the heat absorption part 52 is configured to absorb the heat emitted by the light bar 2; The condensation part 52 is disposed on the outside of the bottom plate 11. The condensation part 52 and the heat absorption part 51 are respectively disposed on the bottom plate 11 and the first side plate 121 of the back plate 1, and the condensation part 52 is disposed on the outer side of the bottom plate 11, so that the heat dissipation capacity of the backlight module 100 can be greatly improved, and at the same time, the design obstacle of the high-performance display module which cannot be applied due to the severe heat generation of the light-emitting element 22 can be partially eliminated to a certain extent, and the design upper limit can be improved.

The above description only shows some embodiments of the present disclosure, but does not limit the scope of the present disclosure. Any equivalent structural or process transformation performed based on the drawings and the specification of the present disclosure, directly or indirectly applied in any other related arts, should be within the scope of the present disclosure.

The invention claimed is:

1. A backlight module, comprising:
a back plate, comprises a bottom plate and a first side plate disposed at one side of the bottom plate;
a light bar, disposed at the inner side of the first side plate; and
a radiator, comprises a heat absorption part, a condensation part, and a pipe; wherein the heat absorption part and the condensation part are communicated with each other by the pipe; and
wherein, the heat absorption part is disposed between the first side plate and the light bar, and the heat absorption part is configured to absorb the heat emitted by the light bar; the condensation part is disposed at the outer side of the bottom plate.

2. The backlight module of claim 1, wherein the bottom plate comprises a first edge and a second edge which are opposite to each other along a first direction; the first edge is configured to be disposed corresponding to the bottom side of a display panel, and the second edge is configured to be disposed corresponding to the top side of the display panel; the first side plate, the light bar and the heat absorption part are disposed on the first edge, and the condensation part is disposed on between first edge and the second edge, and the condensation part is spaced from the heat absorption part.

3. The backlight module of claim 2, wherein the condensation part comprises a top wall and a bottom wall which are opposite to each other and substantially parallel to the bottom plate, and a first side wall and a second side wall which are connected to the top wall and the bottom wall, and the first side wall is located on the side of the second side wall near the first side plate and bent toward the side of the first side plate.

4. The backlight module of claim 3, wherein a bent portion of the first side wall is located in the middle of the first side wall along the second direction, and the second direction is perpendicular to the first direction; along the second direction, from the middle of the condensation part to both ends of the condensation part, the width of the condensation part in the first direction is gradually increased.

5. The backlight module of claim 4, wherein the first side wall is a bent planar structure, and the second side wall is a planar structure.

6. The backlight module of claim 3, wherein the top wall is located on the side of the bottom wall away from the bottom plate; the surface of the top wall away from the bottom plate is provided with a plurality of radiating fins.

7. The backlight module of claim 6, wherein the plurality of radiating fins is disposed at intervals along a second direction, and the second direction is perpendicular to the first direction; along the first direction, one end of each of the plurality of radiating fins extends to the first side wall, and the other end of each of the plurality of radiating fins extends to the second side wall.

8. The backlight module of claim 2, wherein the number of the pipe is two, which comprises a first pipe and a second pipe; the first pipe is disposed on one side of the bottom plate along a second direction, and the second pipe is disposed on the other side of the bottom plate along a second direction, the second direction is perpendicular to the first direction; the first end of the heat absorption part is communicated with the first end of the condensation part by the first pipe; the second end of the heat absorption part is communicated with the second end of the condensation part by the second pipe.

9. The backlight module of claim 8, wherein the back plate further comprises a second side plate and a third side plate which are opposite to each other and connected with both ends of the first side plate; one end of the first pipe is connected with one end of the heat absorption part near the second side plate, and the other end of the first pipe passes through the second side plate and extends away from the first side plate, and the other end of the first pipe is connected with one end of the condensation part near the second side plate.

10. The backlight module of claim 8, wherein one end of the second pipe is connected with one end of the heat absorption part near the third side plate, and the other end of the second pipe passes through the third side plate and extends away from the first side plate, and the other end of the second pipe is connected with one end of the condensation part near the third side plate.

11. A display device comprising a display panel and a backlight module;
wherein the backlight module, comprises:
a back plate, comprises a bottom plate and a first side plate disposed at one side of the bottom plate;
a light bar, disposed at the inner side of the first side plate; and
a radiator, comprises a heat absorption part, a condensation part, and a pipe, wherein the heat absorption part and the condensation part are communicated with each other by the pipe; and
wherein, the heat absorption part is disposed between the first side plate and the light bar, and the heat absorption part is configured to absorb the heat emitted by the light bar; the condensation part is disposed at the outer side of the bottom plate.

12. The display device of claim 11, wherein the bottom plate comprises a first side and a second side which are opposite to each other along a first direction; the first side is configured to be disposed corresponding to the bottom side of a display panel, and the second side is configured to be disposed corresponding to the top side of the display panel; the first side plate, the light bar and the heat absorption part are disposed on the first side, and the condensation part is disposed between first side and the second side, and the condensation part is spaced from the heat absorption part.

13. The display device of claim 12, wherein the condensation part comprises a top wall and a bottom wall which are opposite to each other and substantially parallel to the bottom plate, and a first side wall and a second side wall which are connected to the top wall and the bottom wall, and the first side wall is located on the side of the second side wall near the first side plate and bent toward the side of the first side plate.

14. The display device of claim 13, wherein a bent portion of the first side wall is located in the middle of the first side wall along the second direction, and the second direction is perpendicular to the first direction; along the second direction, from the middle of the condensation part to both ends of the condensation part, the width of the condensation part in the first direction is gradually increased.

15. The display device of claim 14, wherein the first side wall is a bent planar structure, and the second side wall is a planar structure.

16. The display device of claim 13, wherein the top wall is located on the side of the bottom wall away from the bottom plate; the surface of the top wall away from the bottom plate is provided with a plurality of radiating fins.

17. The display device of claim 16, wherein the plurality of radiating fins is disposed at intervals along a second direction, and the second direction is perpendicular to the first direction; along the first direction, one end of each of the plurality of radiating fins extends to the first side surface, and the other end of each of the plurality of radiating fins extends to the second side surface.

18. The display device of claim 12, wherein the number of the pipe is two, which comprises a first pipe and a second pipe; the first pipe and the second pipe are respectively disposed on two sides of the bottom plate along a second direction perpendicular to the first direction; the first end of the heat absorption part is communicated with the first end of the condensation part by the first pipe; the second end of the heat absorption part is communicated with the second end of the condensation part by the second pipe.

19. The display device of claim 18, wherein the back plate further comprises a second side plate and a third side plate which are opposite to each other and connected with both ends of the first side plate; one end of the first pipe is connected with one end of the heat absorption part near the second side plate, and the other end of the first pipe passes through the second side plate and extends away from the first side plate, and the other end of the first pipe is connected with one end of the condensation part near the second side plate.

20. The display device of claim 18, wherein one end of the second pipe is connected with one end of the heat absorption part near the third side plate, and the other end of the second pipe passes through the third side plate and extends away from the first side plate, and the other end of the second pipe is connected with one end of the condensation part near the third side plate.

* * * * *